United States Patent [19]

Beffa

[11] Patent Number: 6,067,507
[45] Date of Patent: *May 23, 2000

[54] METHOD IN AN INTEGRATED CIRCUIT (IC) MANUFACTURING PROCESS FOR IDENTIFYING AND REDIRECTING IC'S MIS-PROCESSD DURING THEIR MANUFACTURE

[75] Inventor: Raymond J. Beffa, Boise, Id.

[73] Assignee: Micron Technology, Inc., Boise, Id.

[ * ] Notice: This patent is subject to a terminal disclaimer.

[21] Appl. No.: 09/302,338

[22] Filed: Apr. 29, 1999

Related U.S. Application Data

[63] Continuation of application No. 08/806,442, Feb. 26, 1997, Pat. No. 5,915,231.

[51] Int. Cl.$^7$ .......................... G06F 19/00; G06G 7/6466
[52] U.S. Cl. ....................... 702/118; 702/118; 702/82; 438/14; 700/116; 700/224; 700/226
[58] Field of Search .................. 700/224, 226, 700/95, 109, 115, 116, 117; 702/118, 117, 81, 82, 83, 84, 120, 182; 438/5, 14, 10, 16, 17

[56] References Cited

U.S. PATENT DOCUMENTS

| | | |
|---|---|---|
| 4,958,373 | 9/1990 | Usami et al. . |
| 4,967,381 | 10/1990 | Lane et al. . |
| 5,103,166 | 4/1992 | Jeon et al. . |
| 5,105,362 | 4/1992 | Kotani . |
| 5,217,834 | 6/1993 | Higaki . |
| 5,219,765 | 6/1993 | Yoshida et al. . |
| 5,226,118 | 7/1993 | Baker et al. . |
| 5,256,578 | 10/1993 | Corley et al. . |
| 5,271,796 | 12/1993 | Miyashita et al. . |
| 5,289,113 | 2/1994 | Meaney et al. . |
| 5,294,812 | 3/1994 | Hashimoto et al. . |
| 5,301,143 | 4/1994 | Ohri et al. . |
| 5,355,320 | 10/1994 | Erjavic et al. . |
| 5,420,796 | 5/1995 | Weling et al. . |
| 5,440,493 | 8/1995 | Doida . |
| 5,442,561 | 8/1995 | Yoshizawa et al. . |
| 5,450,326 | 9/1995 | Black . |
| 5,467,304 | 11/1995 | Uchida et al. . |
| 5,483,175 | 1/1996 | Ahmad et al. . |
| 5,495,417 | 2/1996 | Fuduka et al. . |
| 5,511,005 | 4/1996 | Abbe et al. . |
| 5,537,325 | 7/1996 | Iwakiri et al. . |
| 5,568,408 | 10/1996 | Maeda . |
| 5,570,293 | 10/1996 | Tanaka et al. . |
| 5,726,074 | 3/1998 | Yabe . |
| 5,787,190 | 7/1998 | Peng et al. ............................. 382/145 |
| 5,801,965 | 9/1998 | Takagi et al. . |
| 5,828,778 | 10/1998 | Hagi et al. ............................. 382/145 |
| 5,844,803 | 12/1998 | Beffa . |
| 5,856,923 | 1/1999 | Jones et al. . |
| 5,895,962 | 4/1999 | Zheng et al. ........................... 257/529 |
| 5,907,492 | 5/1999 | Akram et al. ....................... 364/468.28 |
| 5,915,231 | 6/1999 | Beffa ...................................... 702/118 |
| 5,963,881 | 10/1999 | Kahn et al. .............................. 702/35 |

FOREIGN PATENT DOCUMENTS 5-074909  3/1993  Japan .

*Primary Examiner*—Patrick Assouad
*Attorney, Agent, or Firm*—Trask, Britt & Rossa

[57] ABSTRACT

An inventive method of manufacturing IC devices from semiconductor wafers includes providing the wafers and fabricating IC's on the wafers. At probe, a unique fuse ID is stored in each IC, and an electronic wafer map is electronically stored for each wafer indicating the locations of good and bad IC's on the wafer and the fuse ID's of the IC's on the wafer. Each IC is then separated from its wafer to form an IC die, and the IC dice are assembled into IC devices. At the opens/shorts test at the end of assembly, the fuse ID of each IC in each device is automatically retrieved so the wafer map of the IC device may be accessed and evaluated to identify any IC devices containing bad IC's that have accidentally been assembled into IC devices. These "bad" IC devices are discarded, and the remaining IC devices continue on to back-end testing.

23 Claims, 2 Drawing Sheets

METHOD IN AN INTEGRATED CIRCUIT (IC) MANUFACTURING PROCESS FOR IDENTIFYING AND REDIRECTING IC'S MIS-PROCESSD DURING THEIR MANUFACTURE

CROSS-REFERENCE TO RELATED APPLICATIONS

The present application is a continuation of application Ser. No. 08/806,442, filed Feb. 26, 1997, now U.S. Pat. No. 5,915,231, which is related to: an application having Ser. No. 08/591,238, entitled "METHOD AND APARATUS [sic] FOR STORAGE OF TEST RESULTS WITHIN AN INTEGRATED CIRCUIT," and filed Jan. 17, 1996; now abandoned; a application having Ser. No. 08/664,109, entitled "A STRUCTURE AND A METHOD FOR STORING INFORMATION IN A SEMICONDUCTOR DEVICE," and filed Jun. 13, 1996; now U.S. Pat. No 5,895,962 and an application filed Jan. 17, 1997 entitled "METHOD FOR SORTING INTEGRATED CIRCUIT DEVICES."

BACKGROUND OF THE INVENTION

1. Field of the Invention

The present invention relates in general to integrated circuit (IC) manufacturing and, more specifically, to methods in IC manufacturing processes for identifying and redirecting IC's mis-processed during their manufacture.

2. State of the Art

As shown in FIG. 1, a typical process 10 for manufacturing very small electronic circuits referred to as "Integrated Circuits" (IC's) begins with the IC's being formed or "fabricated" on the surface of a wafer 12 of semiconductor material, such as silicon. Once fabricated, IC's are electronically probed to determine whether they are functional (i.e., "good") or nonfunctional (i.e., "bad"), and a computer then stores an electronic wafer map 14 of the wafer 12 identifying the locations of the good and bad IC's on the wafer 12.

After being probed, IC's are sawed from their wafer 12 into discrete IC dice or "chips" using high-speed precision dicing equipment. IC dice identified as good by their wafer map 14 are then each "picked" by automated equipment from their sawed wafer 12 and "placed" on an epoxy coated bonding site of a lead frame, while IC dice identified as bad are discarded into a scrap bin 16. The epoxy attaching the good IC dice to their lead frames is then allowed to cure, and the attached dice are wire bonded to their lead frames using high speed bonding equipment. At this point in the process 10, the lead frames of IC dice are still connected to other lead frames.

Once wire bonded, IC dice and their lead frames are formed into IC packages using a hot thermosetting plastic encapsulant injected into a mold. Leads of the lead frames project from the IC packages after encapsulation, and these leads are dipped in a cleansing chemical bath in a process referred to as "de-flash." After de-flash, IC packages are cured to set their plastic encapsulant, and their projecting leads are then electroplated with a lead/tin finish.

After lead finishing, connections between the lead frames of different IC packages are cut to "singulate" the IC packages into discrete IC devices. Discrete devices are then tested in a simple electronic test that checks for "opens" (i.e., no connection) within the devices where connections should exist and "shorts" (i.e., a connection) where connections should not exist. Devices that fail the opens/shorts test are discarded into the scrap bin 16, and devices that pass proceed to extensive back-end test procedures where they are tested for functionality and operability before being shipped to customers.

On occasion, bad IC dice are accidentally picked from a sawed wafer 12 for subsequent assembly and back-end testing as described above. This can happen, for example, because a human, software, or electronic error causes the automated pick and place equipment described above to access the wrong wafer map 14 for a wafer 12. It can also happen because of a misalignment, referred to as a "registration" error, between the automated pick and place equipment and a wafer 12. In either case, such accidents typically are not detected until the bad IC dice undergo at least some back-end testing and, as a result, waste back-end testing resources. Therefore, there is a need in the art for a method of identifying and discarding accidentally assembled IC dice before the dice undergo back-end testing procedures.

As described in U.S. Pat. Nos. 5,301,143, 5,294,812, and 5,103,166, some methods have been devised to electronically identify IC dice. Such methods take place "off" the manufacturing line, and involve the use of electrically retrievable identification (ID) codes, such as so-called "fuse ID's," programmed into individual IC dice to identify the dice. The programming of a fuse ID typically involves selectively blowing an arrangement of fuses or anti-fuses in an IC die so that when the fuses or anti-fuses are accessed, they output a selected ID code. Unfortunately, none of these methods addresses the problem of identifying and discarding accidentally assembled IC dice "on" a manufacturing line.

SUMMARY OF THE INVENTION

The present invention provides a method that can identify and discard accidentally assembled integrated circuit (IC) dice "on" an IC manufacturing line before the dice undergo back-end testing procedures.

In one embodiment, the method identifies and redirects IC's that have been mis-processed, such as bad IC's identified at probe that have accidentally been assembled and packaged. The method includes storing data, such as an electronic wafer map, at probe, for example, in association with a unique identification (ID) code, such as a fuse ID, of each of the IC's. The stored data indicates a process flow within the IC manufacturing process that each of the IC's should undergo. For example, the stored data may indicate that an IC is bad and should be discarded, or that an IC is good and should be assembled and packaged.

As described above, on occasion, one or more IC's do not undergo the process flow they should undergo. For example, some bad IC's may proceed through assembly and packaging rather than being discarded. To check for IC's that have not undergone the process flow they should undergo, the present method also includes reading the ID code of each of the IC's at, for example, the opens/shorts test at the end of assembly. The data (e.g., the wafer map) stored in association with the ID code of each of the IC's is then accessed and evaluated to identify any IC's that have undergone a process flow within the IC manufacturing process that is different from the process flow their data indicates they should have undergone, such as bad IC's that have proceeded through assembly and packaging. Any IC's identified as having been mis-processed are then redirected within the IC manufacturing process. Thus, for example, bad IC's that have been assembled and packaged may be discarded so they do not proceed to back-end testing.

In another embodiment of the present invention, a method of manufacturing IC devices, such as Dynamic Random Access Memory Devices (DRAM's), from semiconductor wafers includes providing the semiconductor wafers and fabricating IC's on the wafers. A substantially unique ID code, such as a fuse ID, is then stored in each of the IC's, and data is stored in association with the ID code of each of the IC's that indicates a manufacturing process flow that each of the IC's should undergo. Each IC is then separated from its wafer to form an IC die, and the IC dice are assembled into IC devices, such as wire bond/lead frame devices, Chip On Board (COB) devices, or flip-chip devices. The ID code associated with each of the IC devices is then read, and the data stored in association with the ID code associated with each of the IC devices is accessed and evaluated to identify any IC devices that have undergone a manufacturing process flow that is different from the manufacturing process flow their data indicates they should have undergone. These identified IC devices are then redirected (e.g., discarded), and the remaining IC devices continue on to back-end testing.

A further embodiment of the present invention comprises a method of manufacturing Multi-Chip Modules (MCM's) similar to the method of manufacturing IC devices described above.

A still further embodiment of the present invention comprises another method of manufacturing IC devices from semiconductor wafers. The method includes providing the semiconductor wafers and fabricating IC's on the wafers. Each IC is electronically probed to identify good and bad IC's on the wafers and then programmed with a unique fuse ID. An electronic wafer map is stored for each wafer indicating the locations of good and bad IC's on the wafer and associating each IC on the wafer with its fuse ID. Each IC is then sawed from its wafer to form a discrete IC die that is automatically picked and placed on an epoxy coated bonding site of a lead frame. The epoxy is allowed to cure, and the IC dice are then wire bonded to their respective lead frames. Next, the IC dice and their associated lead frames are injection molded to form IC packages. Projecting leads of the packages are then de-flashed, the packages are cured, and the leads are then electroplated. Then, each package is singulated to form a discrete IC device, and each device is tested for opens and shorts. The fuse ID associated with each IC device is then electrically retrieved so the wafer map stored in association with the fuse ID associated with each of the IC devices may be accessed and evaluated to identify any IC devices that include a bad IC and any IC devices that include a good IC. Any IC devices identified as including a bad IC are discarded, and any IC devices identified as including a good IC proceed to back-end testing.

DETAILED DESCRIPTION OF THE INVENTION

Figure 1:
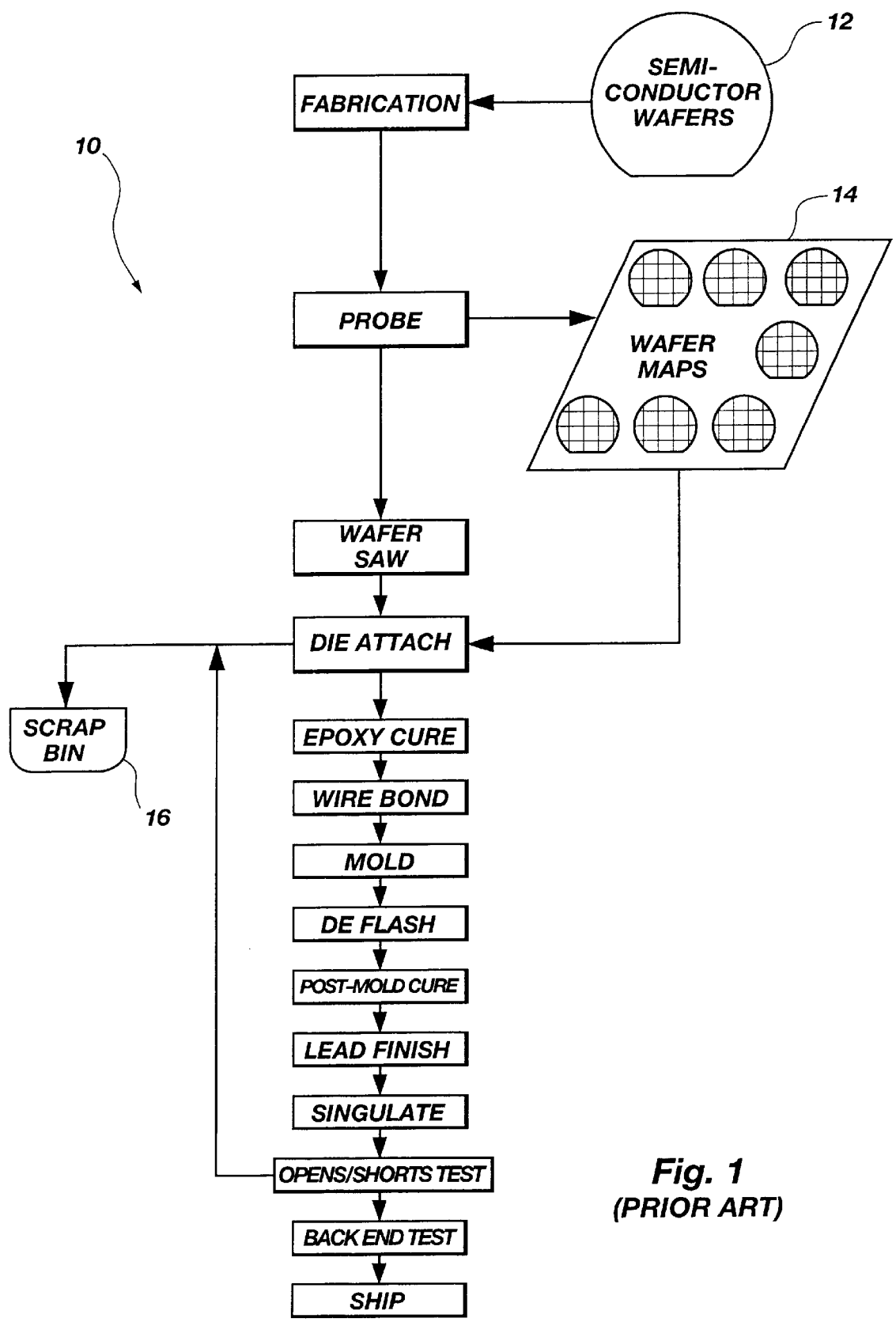
FIG. 1 is a flow diagram illustrating a conventional integrated circuit (IC) manufacturing process.
Figure 2:
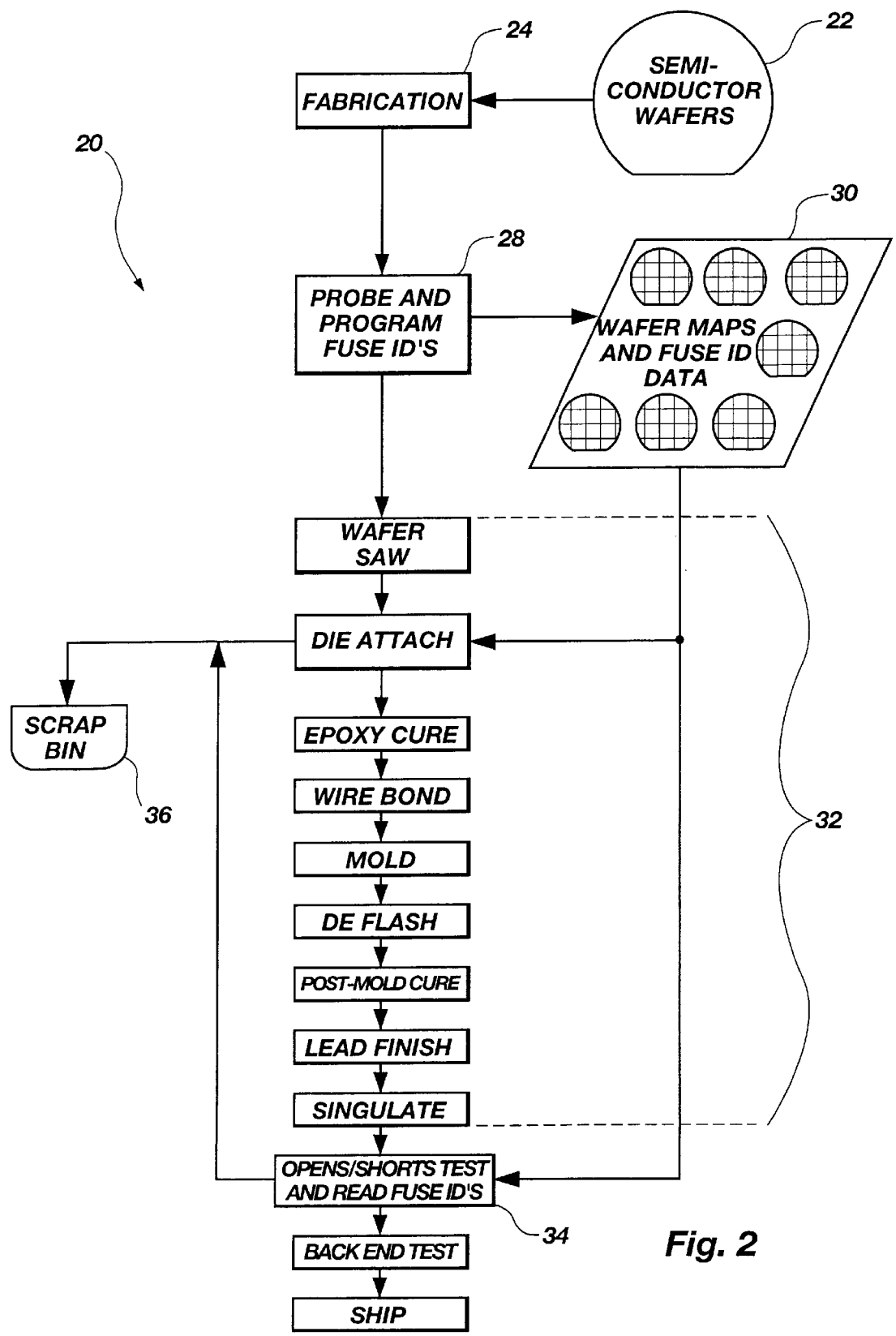
FIG. 2 is a flow diagram illustrating an IC manufacturing process in which accidentally assembled IC dice are identified and discarded in accordance with the present invention before back-end testing.

As shown in FIG. 2, an inventive method 20 for manufacturing integrated circuits (IC's) from a group of semiconductor wafers 22 includes the step 24 of fabricating the IC's on the wafers 22. It will be understood by those having skill in the field of this invention that the present invention is applicable to any IC devices, including Dynamic Random Access Memory (DRAM) IC's, Static Random Access Memory (SRAM) IC's, Synchronous DRAM (SDRAM) IC's, processor IC's, Single In-line Memory Modules (SIMM's), Dual In-line Memory Modules (DIMM's), and other Multi-Chip Modules (MCM's). It will also be understood that although the present invention will be described below in the context of a wire bond/lead frame assembly process, the present invention is applicable to any IC assembly process, including, for example, Chip On Board (COB), flip chip, and Tape-Automated Bonding (TAB) processes.

After fabrication, the IC's are electronically probed in a probe step 28 to evaluate a variety of their electronic characteristics, and data from the probe step 28 identifying bad and good IC's are noted and stored as wafer maps 30, as described above. During the probe step 28, IC's fabricated on the wafers 22 are programmed in the manner described above with a fuse identification (ID) unique to each IC. The fuse ID for each IC is then stored in association with the wafer maps 30 such that each die location on each wafer map 30 is associated with the unique fuse ID of a particular IC. The fuse ID may identify, for example, a wafer lot ID, the week the IC's were fabricated, a wafer ID, a die location on the wafer, and a fabrication facility ID.

It will be understood, of course, that the present invention includes within its scope IC's having any ID code, including those having fuse ID's. It will also be understood that the IC's may be programmed with their fuse ID's at steps in the manufacturing process 20 other than the probe step 28.

Once programmed, the IC's proceed through an assembly process 32 to an opens/shorts test 34 as described above. At the opens/shorts test 34, the fuse ID of each IC is automatically read and correlated with the wafer map 30 of its wafer 22. If a bad IC has accidentally proceeded through the assembly process 32, the fuse ID of the IC, in correlation with the wafer map 30 of the IC's wafer 22, will identify the IC as a bad IC so it can be discarded to a scrap bin 36 instead of proceeding through back-end testing. The present invention thus provides a method of identifying and discarding accidentally assembled IC's before they undergo back-end testing.

It should be understood that although the fuse ID's of IC's in the process 20 are typically read electronically, they may also be read optically if the fuse ID's consist of "blown" laser fuses that are optically accessible. It should also be understood that the present invention includes within its scope any method in an IC manufacturing process for identifying and redirecting IC's mis-processed during their manufacture using ID codes such as fuse ID's.

Although the present invention has been described with reference to a preferred embodiment, the invention is not limited to this embodiment. For example, while the various steps of the preferred embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. A manufacturing process for an integrated circuit device, said manufacturing process redirecting one or more integrated circuit devices that have been mis-processed, each integrated circuit device having a substantially unique identification code, the method comprising:

storing data and the identification code of each integrated circuit device of the integrated circuit devices, said data indicating a process flow within the manufacturing process for each integrated circuit device of the integrated circuit devices;

reading the identification code of each integrated circuit device of the integrated circuit devices;

accessing the data stored and the identification code of each integrated circuit device of the integrated circuit devices;

evaluating the data accessed for each integrated circuit device of the integrated circuit devices;

identifying any integrated circuit devices having undergone a process flow within the manufacturing process different from the process flow of their stored data; and redirecting any integrated circuit device of the integrated circuit devices identified as having been mis-processed.

2. The method of claim 1, wherein storing data comprises storing the identification code of each of the integrated circuit devices and a die location on an electronically stored wafer map.

3. The method of claim 1, wherein storing data comprises storing data at a probe.

4. The method of claim 1, wherein storing data comprises storing data and the identification code of each integrated circuit device of the integrated circuit devices to indicate each integrated circuit device of the integrated circuit devices is one of a good integrated circuit device usable for assembly and back-end testing and a bad integrated circuit device suitable for being discarded.

5. The method of claim 1, wherein reading the identification code of each integrated circuit device of the integrated circuit devices comprises electrically retrieving a unique fuse identification programmed into each integrated circuit device of the integrated circuit devices.

6. The method of claim 1, wherein reading the identification code of each integrated circuit device of the integrated circuit devices comprises optically reading a unique identification code provided on each integrated circuit device of the integrated circuit devices.

7. The method of claim 6, wherein optically reading the unique identification code provided on each integrated circuit device of the integrated circuit devices comprises optically reading a unique laser fuse identification programmed into each integrated circuit device of the integrated circuit devices.

8. The method of claim 1, wherein reading the identification code of each integrated circuit device of the integrated circuit devices comprises reading the identification code of each integrated circuit device of the integrated circuit devices at an opens/shorts test in the manufacturing process.

9. The method of claim 1, wherein accessing the data stored and the identification code of each integrated circuit device of the integrated circuit devices comprises accessing the data stored and the identification code of each integrated circuit device of the integrated circuit devices at an opens/shorts test in the manufacturing process.

10. The method of claim 1, wherein evaluating the data comprises evaluating the data accessed for each integrated circuit device of the integrated circuit devices to identify any bad integrated circuit devices having accidentally undergone an assembly procedure within the manufacturing process.

11. The method of claim 1, wherein evaluating the data comprises evaluating the data at an opens/shorts test in the manufacturing process.

12. The method of claim 10, wherein redirecting any integrated circuit device identified as having been mis-processed comprises discarding any integrated circuit device identified as having been mis-processed.

13. The method of claim 1, wherein redirecting occurs before a back-end test procedure within the integrated circuit device manufacturing process.

14. The method of claim 1, further comprises assembling the integrated circuit devices into packaged integrated circuit devices after storing data and before reading the identification code of each of the integrated circuit devices.

15. A method of manufacturing integrated circuit devices from semiconductor wafers, the method comprising:

providing a plurality of semiconductor wafers;

fabricating a plurality of integrated circuit devices on each wafer of the plurality of semiconductor wafers;

causing each integrated circuit device of the integrated circuit devices on each wafer of the plurality of semiconductor wafers to store a substantially unique identification code;

storing data and the identification code of each integrated circuit device of the integrated circuit devices indicating the manufacturing process flow for each integrated circuit device of the integrated circuit devices;

separating each integrated circuit device of the integrated circuit devices on each wafer of the plurality of semiconductor wafers, forming one integrated circuit device of a plurality of integrated circuit devices;

assembling each integrated circuit device of the integrated circuit devices into an integrated circuit device;

reading the identification code of each integrated circuit device of the integrated circuit devices;

accessing the data stored and the identification code associated with each integrated circuit device of the integrated circuit devices;

evaluating the data accessed for each integrated circuit device of the integrated circuit devices identifying any integrated circuit devices having undergone a manufacturing process flow different from the indicated manufacturing process flow of their stored data;

redirecting any integrated circuit device identified as having undergone a manufacturing process flow different from the indicated manufacturing process flow of its stored data; and back-end testing any non-redirected integrated circuit devices.

16. The method of claim 15, wherein fabricating a plurality of integrated circuit devices on each wafer of the plurality of semiconductor wafers comprises fabricating integrated circuit devices selected from a group comprising Dynamic Random Access Memory (DRAM) devices, Static Random Access Memory (SRAM) devices, Synchronous DRAM (SDRAM) devices, and processor devices.

17. The method of claim 15, wherein causing each integrated circuit device of the integrated circuit devices on each wafer of the plurality of semiconductor wafers to store a substantially unique identification code comprises programming each integrated circuit device of the integrated circuit devices on each wafer of the plurality of semiconductor wafers to permanently store a unique fuse identification.

18. The method of claim 17, wherein programming each integrated circuit device of the integrated circuit devices on each wafer of the plurality of semiconductor wafers to permanently store a unique fuse identification comprises programming at least one of the fuses and the anti-fuses in each integrated circuit device of the integrated circuit devices on each wafer of the plurality of semiconductor wafers to permanently store a unique fuse identification.

19. The method of claim 15, wherein assembling each integrated circuit device of the integrated circuit devices into an integrated circuit device comprising:

picking each integrated circuit device of the integrated circuit devices from its wafer;

placing each integrated circuit device of the integrated circuit devices onto an epoxy coated bonding site of one of a plurality of lead frames;

curing the epoxy on the bonding site of each of the lead frames;

wire bonding each integrated circuit device of the integrated circuit devices to its associated lead frame;

injection molding each integrated circuit device of the integrated circuit devices and the associated lead frame to form one of a plurality of integrated circuit device packages, each having projecting leads;

de-flashing the projecting leads of each integrated circuit device package of the plurality of integrated circuit device packages;

curing each integrated circuit device package of the plurality of integrated circuit device packages;

electroplating the projecting leads of each integrated circuit device package of the plurality of integrated circuit device packages;

singulating each integrated circuit device package of the plurality of integrated circuit device packages into one of a plurality of discrete integrated circuit devices; and testing each integrated circuit device of the integrated circuit devices for opens and shorts.

20. The method of claim 15, wherein assembling each integrated circuit device of the integrated circuit devices into an integrated circuit device comprises assembling each integrated circuit device of the integrated circuit devices into an integrated circuit device selected from a group comprising a wire bond/lead frame integrated circuit device, a Chip-On-Board (COB) integrated circuit devices a flip-chip integrated circuit device, and a Tape-Automated Bonding (TAB) integrated circuit device.

21. A method of manufacturing Multi-Chip Modules from semiconductor wafers, the method comprising:

providing a plurality of semiconductor wafers;

fabricating a plurality of integrated circuit devices on each wafer of the plurality of semiconductor wafers;

causing each integrated circuit device of the integrated circuit devices on each wafer of the plurality of semiconductor wafers to store a substantially unique identification code;

storing data and the identification code of each integrated circuit device of the integrated circuit devices indicating a desired manufacturing process flow for each integrated circuit device of the integrated circuit devices;

separating each integrated circuit device of the integrated circuit devices on each wafer of the plurality of semiconductor wafers from the wafer to form one of a plurality of integrated circuit devices;

assembling one or more integrated circuit devices of the integrated circuit devices into each of a plurality of multi-chip modules;

reading the identification code of each integrated circuit device of the integrated circuit devices in each of the multi-chip modules;

accessing the data stored and the identification code of each integrated circuit device of the integrated circuit devices in each of the multi-chip modules;

evaluating the data accessed for each integrated circuit device of the integrated circuit devices in each of the multi-chip modules identifying any multi-chip modules having integrated circuit devices having undergone a manufacturing process flow that is different from the desired manufacturing process flow;

redirecting any multi-chip modules identified as having integrated circuit devices having undergone a manufacturing process flow that is different from the desired manufacturing process flow; and back-end testing any non-redirected multi-chip modules.

22. The method of claim 21, wherein the multi-chip modules are selected from a group comprising Single In-Line Memory Modules (SIMM's) and Dual In-line Memory Modules (DIMM's).

23. A method of manufacturing integrated circuit devices from semiconductor wafers, the method comprising:

providing a plurality of semiconductor wafers;

fabricating a plurality of integrated circuit devices on each wafer of the plurality of semiconductor wafers;

electronically probing each integrated circuit device of the integrated circuit devices on each wafer of the plurality of semiconductor wafers to identify good and defective integrated circuit devices on each wafer of the plurality of semiconductor wafers;

programming each integrated circuit device of the integrated circuit devices on each wafer of the plurality of semiconductor wafers to store a unique fuse identification;

storing an electronic wafer map for each wafer that identifies locations of good and defective integrated circuit devices on the wafer associating each integrated circuit device on the wafer with its fuse identification;

sawing each integrated circuit device of the integrated circuit devices on each wafer of the plurality of semiconductor wafers from its wafer to form one of a plurality of discrete integrated circuit devices;

automatically picking each integrated circuit device of the integrated circuit devices from the wafer;

placing each integrated circuit device of the integrated circuit devices onto an epoxy coated bonding site of one of a plurality of lead frames;

curing the epoxy on the bonding site of each lead frame of the plurality of lead frames;

wire bonding each integrated circuit device of the integrated circuit devices to an associated lead frame;

injection molding each integrated circuit device of the integrated circuit devices and the associated lead frame forming one of a plurality of integrated circuit device packages, each package having projecting leads;

de-flashing the projecting leads of each integrated circuit device package of the integrated circuit device packages;

curing each integrated circuit device package of the integrated circuit device packages;

electroplating the projecting leads of each integrated circuit device package of the integrated circuit device packages;

singulating each integrated circuit device package of the integrated circuit device packages into one of a plurality of discrete integrated circuit devices;

testing each integrated circuit device of the integrated circuit devices for opens and shorts;

electrically retrieving the fuse identification associated with each integrated circuit device of the integrated circuit devices;

accessing the wafer map stored in association with the fuse identification associated with each integrated circuit device of the integrated circuit devices;

evaluating the wafer map accessed for each integrated circuit device of the integrated circuit devices identifying any defective integrated circuit device and any good integrated circuit device;

discarding any integrated circuit device identified as a defective integrated circuit device; and back-end testing any integrated circuit device identified as a good integrated circuit device.

* * * * *

UNITED STATES PATENT AND TRADEMARK OFFICE
CERTIFICATE OF CORRECTION

PATENT NO. : 6,067,507
DATED : May 23, 2000
INVENTOR(S) : Raymond J. Beffa

It is certified that error appears in the above-identified patent and that said Letters Patent is hereby corrected as shown below:

Title page, Item [54] and Column 1, line 4,
Title, change "MIS-PROCESSD" to -- MIS-PROCESSED --

Title page,
Item [56], References Cited, U.S. PATENT DOCUMENTS, before "7/1998" insert -- * --; before 10/1998" insert -- * --; before "4/1999" insert -- * --; before "5/1999" insert -- * --; before "6/1999" insert -- * --; before "10/1999" insert -- * --; and insert -- * cited by examiner --

Column 1,
Line 16, before "application" change "a" to -- an --
Line 19, change "No" to -- No. --

Column 4,
Lines 29 and 43, change "process" to -- invention method --

Column 7,
Line 36, change "devices" to -- device, --

Column 8,
Line 39, before "wafer" change "the" to -- each --

Signed and Sealed this

Twenty-eighth Day of December, 2004

JON W. DUDAS
*Director of the United States Patent and Trademark Office*